US009524960B2

(12) United States Patent
Gogoi

(10) Patent No.: US 9,524,960 B2
(45) Date of Patent: Dec. 20, 2016

(54) VERTICAL TRANSISTOR WITH FLASHOVER PROTECTION

(71) Applicant: Bishnu Gogoi, Tucson, AZ (US)

(72) Inventor: Bishnu Gogoi, Tucson, AZ (US)

(73) Assignee: EMPIRE TECHNOOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/761,599

(22) PCT Filed: Apr. 1, 2014

(86) PCT No.: PCT/US2014/032586
§ 371 (c)(1),
(2) Date: Jul. 16, 2015

(87) PCT Pub. No.: WO2015/152904
PCT Pub. Date: Oct. 8, 2015

(65) Prior Publication Data
US 2016/0155734 A1 Jun. 2, 2016

(51) Int. Cl.
*H01L 29/66* (2006.01)
*H01L 29/78* (2006.01)
(Continued)

(52) U.S. Cl.
CPC ....... *H01L 27/0251* (2013.01); *H01L 27/0248* (2013.01); *H01L 29/0692* (2013.01); *H01L 29/66666* (2013.01); *H01L 29/7827* (2013.01)

(58) Field of Classification Search
CPC ............. H01L 27/0251; H01L 29/7827; H01L 29/0692
(Continued)

(56) References Cited

U.S. PATENT DOCUMENTS 5,686,755 A 11/1997 Malhi
5,912,490 A 6/1999 Hebert et al.
(Continued)

FOREIGN PATENT DOCUMENTS

EP 1096573 A2 5/2001
JP S6119177 A 1/1986
WO 2005083775 A1 9/2005

OTHER PUBLICATIONS

Cai, W.Z., et al., "TCAD Analysis of a Vertical RF Power Transistor," International Conference on Simulation of Semiconductor Processes and Devices, pp. 249-252 (Sep. 9-11, 2009).
(Continued)

*Primary Examiner* — Cuong Q Nguyen
(74) *Attorney, Agent, or Firm* — Turk IP Law, LLC

(57) ABSTRACT

Technologies are generally described for increase of spacing between source and drain regions of a vertical high voltage transistor without a significant corresponding increase in the die size. In some examples, active silicon (at drain potential) may be removed at an edge of the die in the scribe grid so that the active silicon is approximately below a surface of the edge termination formed by a region of deep dielectric filled trenches. The recessed drain region at the edge of the die may increase a flashover distance without appreciably increasing the die size. Thus, a distance between the recessed drain region and the surface source region may be increased by a combination of vertical and lateral spacing resulting in a smaller overall die size and smaller parasitic capacitances when operated with substantially the same operating voltage.

20 Claims, 8 Drawing Sheets

(51) Int. Cl.
*H01L 27/02* (2006.01)
*H01L 29/06* (2006.01)

(58) Field of Classification Search
USPC .................................................. 257/328–332
See application file for complete search history.

(56) References Cited

U.S. PATENT DOCUMENTS

| | | |
|---|---|---|
| 6,194,760 B1 | 2/2001 | Lee |
| 6,255,695 B1 | 7/2001 | Kubota et al. |
| 6,271,552 B1 | 8/2001 | D'Anna |
| 6,713,814 B1 | 3/2004 | Koscielniak |
| 6,750,105 B2 | 6/2004 | Disney |
| 6,777,293 B1 | 8/2004 | Koscielniak |
| 7,019,365 B2 | 3/2006 | Sato et al. |
| 7,233,044 B2 | 6/2007 | Dudek |
| 7,276,747 B2 | 10/2007 | Loechelt et al. |
| 7,420,249 B2 | 9/2008 | Sato et al. |
| 7,585,743 B2 | 9/2009 | Renna et al. |
| 7,696,568 B2 * | 4/2010 | Hwang ............ H01L 21/823418 257/330 |
| 7,732,286 B2 | 6/2010 | Hanafi et al. |
| 7,847,350 B2 | 12/2010 | Davies |
| 7,847,369 B2 | 12/2010 | Davies |
| 8,063,467 B2 * | 11/2011 | Tischler ............ H01L 21/76232 257/487 |
| 8,067,834 B2 | 11/2011 | Moline |
| 8,097,910 B2 | 1/2012 | Juengling |
| 8,213,226 B2 | 7/2012 | Carman |
| 8,362,536 B2 | 1/2013 | Chung et al. |
| 8,501,578 B2 * | 8/2013 | Gogoi .................. H01L 21/764 257/E21.546 |
| 2001/0026989 A1 | 10/2001 | Thapar |
| 2006/0091453 A1 | 5/2006 | Matsuda et al. |
| 2007/0224763 A1 | 9/2007 | Fujimoto et al. |
| 2009/0008709 A1 | 1/2009 | Yedinak et al. |
| 2009/0057711 A1 | 3/2009 | Chen |
| 2010/0200914 A1 | 8/2010 | Hamada |
| 2011/0298040 A1 | 12/2011 | Kim |
| 2012/0086045 A1 | 4/2012 | Molin et al. |
| 2012/0086051 A1 | 4/2012 | Wang et al. |
| 2012/0094454 A1 | 4/2012 | Cho et al. |
| 2012/0161226 A1 | 6/2012 | Darwish |
| 2012/0248528 A1 | 10/2012 | Wilson et al. |
| 2013/0221433 A1 | 8/2013 | Molin et al. |

OTHER PUBLICATIONS

Gogoi, B., et al., "New vertical silicon microwave power transistor structure and package with inherent thermal self protection," IEEE MTT-S International Microwave Symposium Digest, pp. 569-572 (Jun. 7-12, 2009).

International Search Report and Written Opinion for International Application No. PCT/US14/32586 mailed Aug. 21, 2014.

Lorenz, L., et al., "COOLMOS™—a new milestone in high voltage Power MOS," The 11th International Symposium on Power Semiconductor Devices and ICs, pp. 3-10 (1999).

Wayne, B., et al., "RF-LDMOS : A device technology for high power RF infrastructure applications," IEEE Compound Semiconductor Integrated Circuit Symposium, pp. 189-192 (Oct. 24-27, 2004).

* cited by examiner

VERTICAL TRANSISTOR WITH FLASHOVER PROTECTION

CROSS-REFERENCE TO RELATED APPLICATION

This Application is the U.S. National Stage filing under 35 U.S.C §371 of PCT Application Ser. No. PCT/US14/32586 filed on Apr. 1, 2014. The PCT Application is herein incorporated by reference in its entirety.

BACKGROUND

Unless otherwise indicated herein, the materials described in this section are not prior art to the claims in this application and are not admitted to be prior art by inclusion in this section.

Vertical power transistors may maintain a high voltage difference between a source terminal and a drain terminal of a substrate comprising the transistor. The drain terminal may be a bottom side of the substrate, the source terminal may be a top side of the substrate, and a drain potential may be a space between the source and drain terminals within the substrate. The drain potential may be high, around 250 V for example. Consequently, the source terminal may have to be kept at a distance greater than a flashover distance between the source and drain terminals causing the drain potential space in the substrate to be large.

Current attempts to provide flashover protection may use improvements and/or alternative or additional solutions in order to effectively provide flashover protection without compromising size of the substrate.

SUMMARY

The present disclosure is generally directed to vertical transistor devices with flashover protection and methods of fabricating such devices.

According to some examples, a semiconductor device is described. An example semiconductor device may include a substrate having a top portion and a bottom portion, a source terminal configured in contact with the top portion of the substrate, a drain region configured in contact with the bottom portion of the substrate, and an insulating dielectric layer. The insulating dielectric layer may be located in the top portion of the substrate and configured in contact with the source region, where the substrate may include a cavity region located substantially between the insulating dielectric layer and the bottom portion of the substrate.

According to other examples, methods of fabricating a semiconductor device are described. An example method may include forming a drain region at a bottom portion of a substrate, forming a vertical spacer gate and a source region in the substrate, forming an insulating dielectric layer in a top portion of the substrate such that the insulating dielectric layer contacts the source region, and forming a cavity region located substantially between the insulating dielectric layer and the bottom portion of the substrate.

According to further examples, methods of fabricating a vertical transistor with flashover protection are described. An example method may include forming a drain region at a bottom portion of a substrate, forming a source region in a top portion of the substrate, forming an insulating dielectric layer in the top portion of the substrate near an edge of the vertical transistor such that the insulating dielectric layer is configured to contact the source region, and forming a cavity region in a portion of the substrate and a portion of the insulating dielectric layer along the edge of the vertical transistor effective to increase a flashover distance for a particular operating voltage without increasing a die size.

According to yet other examples, methods of fabricating a semiconductor device are described. An example method may include forming a drain region at a bottom portion of a substrate, forming a gate and a source region in a top portion of the substrate, forming an insulating dielectric layer in a top portion of the substrate near a first edge of the semiconductor device such that the insulating dielectric layer is configured to contact the source region, and forming a cavity region in the substrate along the first edge of the semiconductor device such that the bottom portion of the substrate is left intact.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
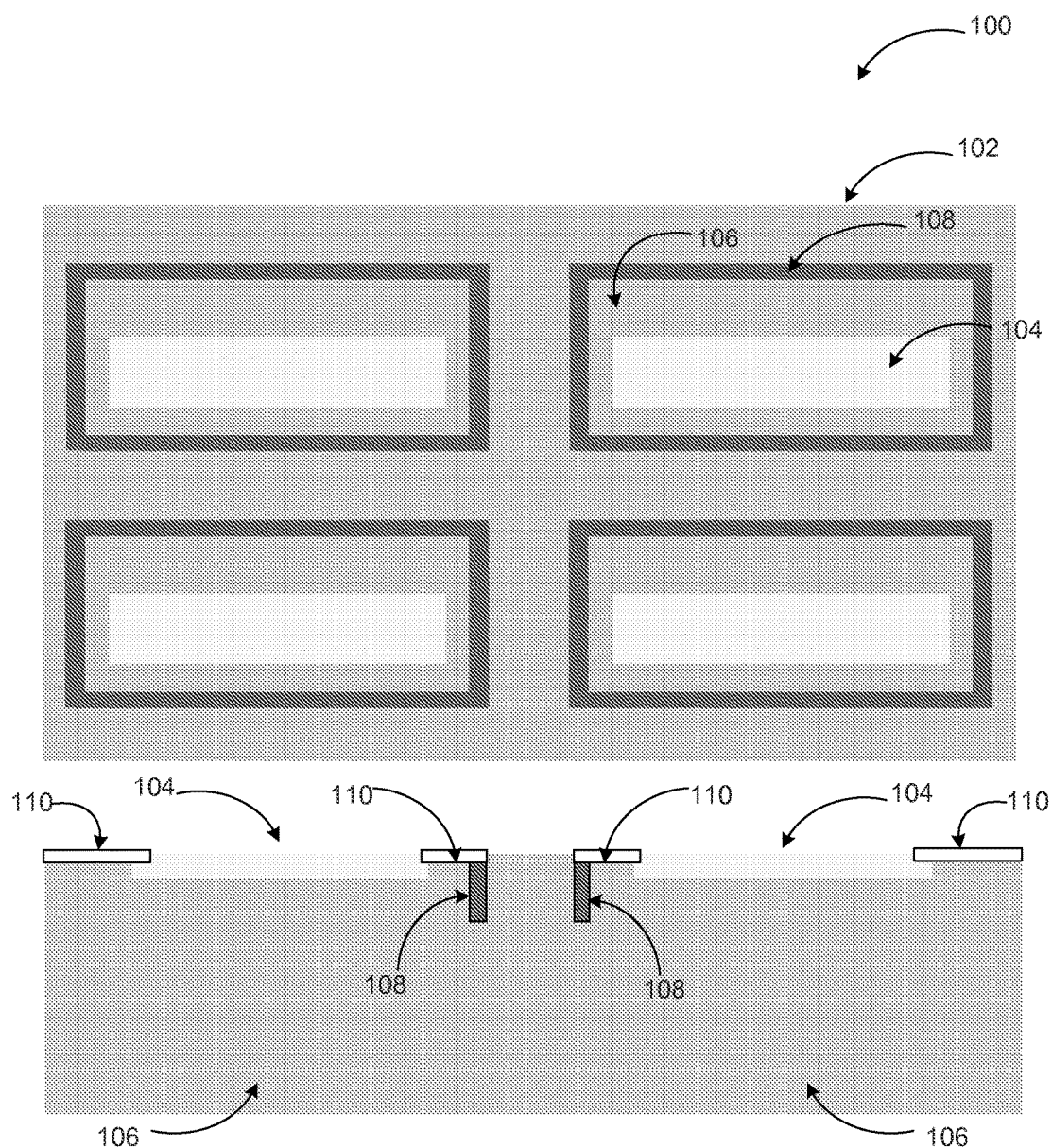
FIG. 1 illustrates top and side views of an example vertical transistor with increased active area die.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to apparatus, devices, and/or methods related to vertical transistor devices with flashover protection.

Briefly stated, technologies are generally described for increase of spacing between source and drain regions of a vertical high voltage transistor without a significant corresponding increase in the die size. In some examples, active silicon (at drain potential) may be removed at an edge of the die in the scribe grid so that the active silicon is approximately below a surface of the edge termination formed by a region of deep dielectric filled trenches. The recessed drain region at the edge of the die may increase a flashover distance without appreciably increasing the die size. Thus, a distance between the recessed drain region and the surface source region may be increased by a combination of vertical and lateral spacing resulting in a smaller overall die size and smaller parasitic capacitances when operated with substantially the same operating voltage.

FIG. 1 illustrates top and side views of an example vertical transistor with increased active area die, arranged in accordance with at least some embodiments described herein.

In a diagram 100, an example vertical transistor may be composed of a substrate 102 that includes a source terminal 104, a drain terminal 106, and a dielectric platform 108 as seen in a top and side view of the vertical transistor. The substrate 102 may also include an insulating dielectric layer 110 that is configured to contact an end of the source terminal 104 and also contact a termination of the dielectric platform 108, as seen in the side view of the vertical transistor. The insulating dielectric layer 110 may also be arranged in contact with another end of the source terminal 104 and also in contact with an edge of the substrate 102, as further seen in the side view of the vertical transistor.

Diagram 100 shows a top view of an example substrate 102 with four example transistor structures prior to etching and scribing. In conventional transistors, to increase the flashover distance (distance between the source terminal 104 and the drain terminal 106), the size of the dielectric may be increased resulting in larger die size and/or smaller yield per wafer.

Figure 2:
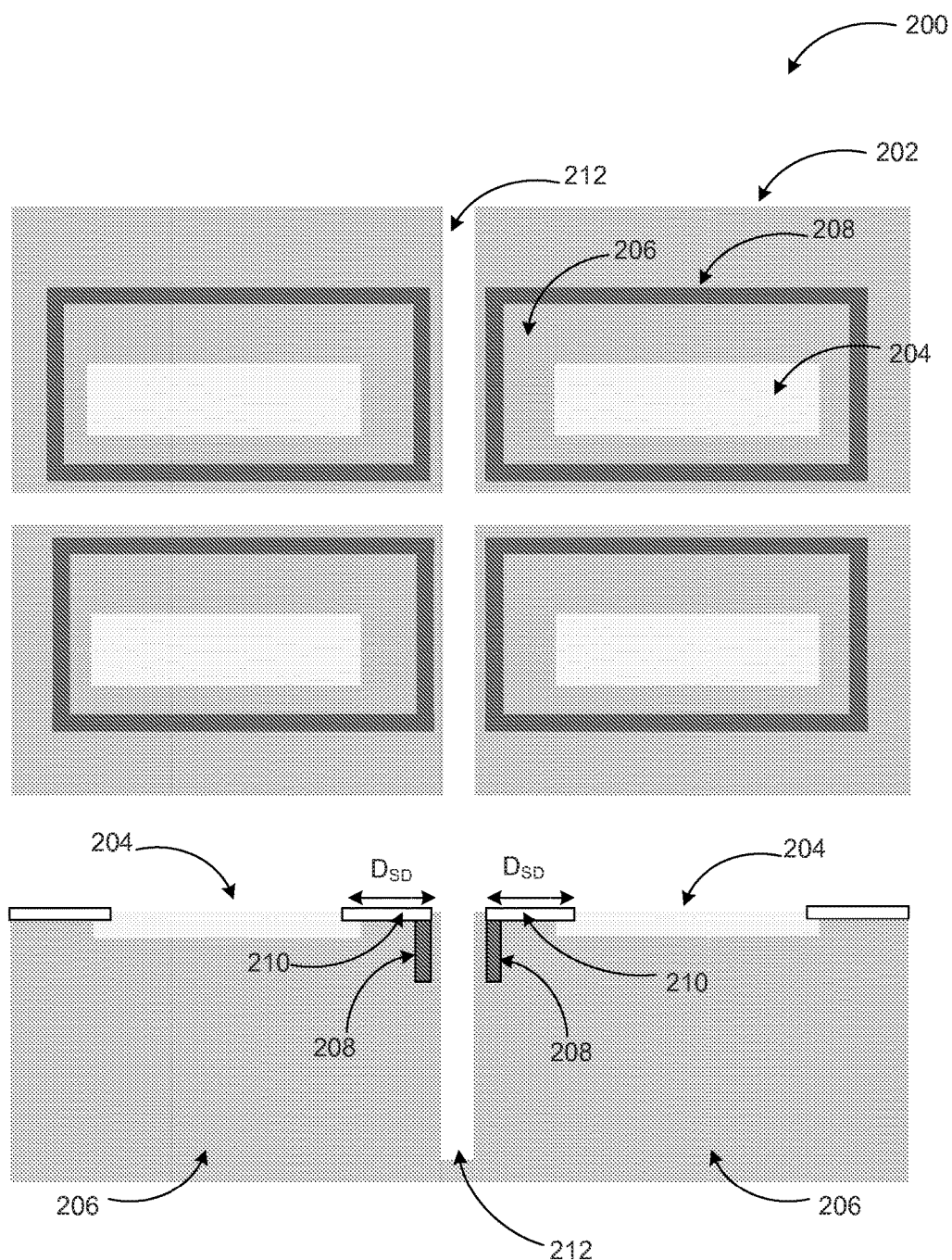
FIG. 2 illustrates top and side views of an example vertical transistor with a vertical trench to increase effective flashover distance.

FIG. 2 illustrates top and side views of an example vertical transistor with a vertical trench to increase effective flashover distance, arranged in accordance with at least some embodiments described herein.

In a diagram 200, an example vertical transistor may be composed of a substrate 202 that includes a source terminal 204, a drain terminal 206, a dielectric platform 208, and a trench 212, as seen in a top and side view of the vertical transistor. The substrate 202 may also include an insulating dielectric layer 210 that is configured to contact an end of the source terminal 204 and also contact a termination of the dielectric platform 208, as seen in the side view of the vertical transistor.

Diagram 200 shows transistor structures similar to FIG. 1 after etching and scribing is completed. Because a portion of the substrate (hence the drain region) still exists next to the dielectric platform 208, the flashover distance in this configuration is defined by the length of insulating dielectric layer 210.

Figure 3:
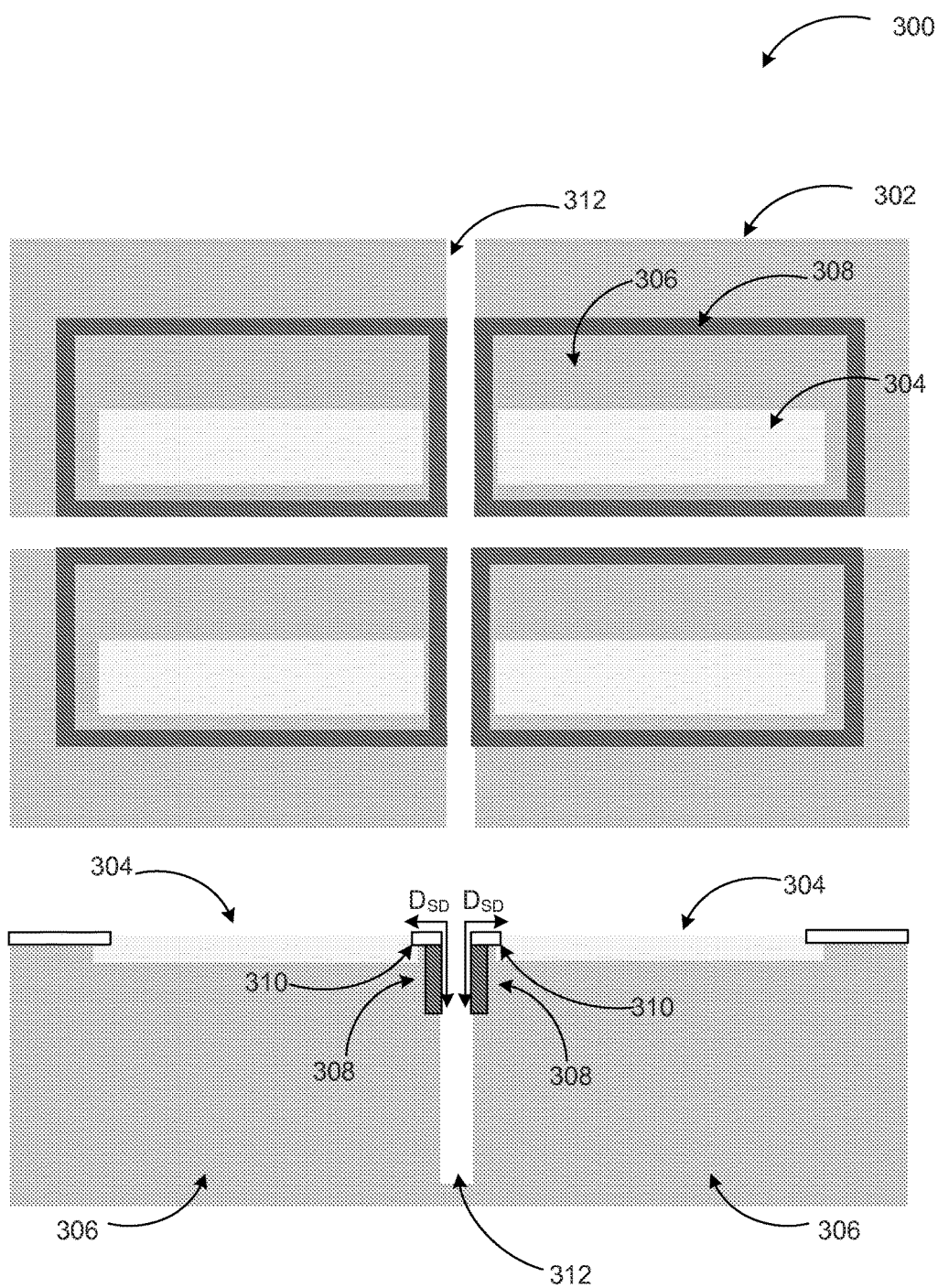
FIG. 3 illustrates top and side views of another example vertical transistor with a vertical trench to increase effective flashover distance.

FIG. 3 illustrates top and side views of another example vertical transistor with a vertical trench to increase effective flashover distance, arranged in accordance with at least some embodiments described herein.

In a diagram 300, an example vertical transistor may be composed of a substrate 302 that includes a source terminal 304, a drain terminal 306, a dielectric platform 308, and a trench 312, as seen in a top and side view of the vertical transistor. The substrate 302 may also include an insulating dielectric layer 310 that is arranged in contact with an end of the source terminal 304 and also in contact with a termination of the dielectric platform 308, as seen in the side view of the vertical transistor. The insulating dielectric layer 310 may also be arranged in contact with another end of the source terminal 304 and also in contact with an edge of the substrate 302, as further seen in the side view of the vertical transistor.

Differently from the configurations of FIG. 1 and FIG. 2, the insulating dielectric layer 310 in diagram 300 is shorter with the source terminal 304 having a larger area. In this configuration, the source spacing to die edge can be decreased and the active area can be increased. The flashover distance comprises the lateral dielectric length (insulating dielectric layer 310) and the vertical dielectric length (dielectric platform 308). Thus, the flashover distance can be increased without having to significantly increase die size or decrease the active area. Source and drain potential can be less than the flashover voltage enabling reduction of die size for same power requirement or increase of power for same die area.

Figure 4:
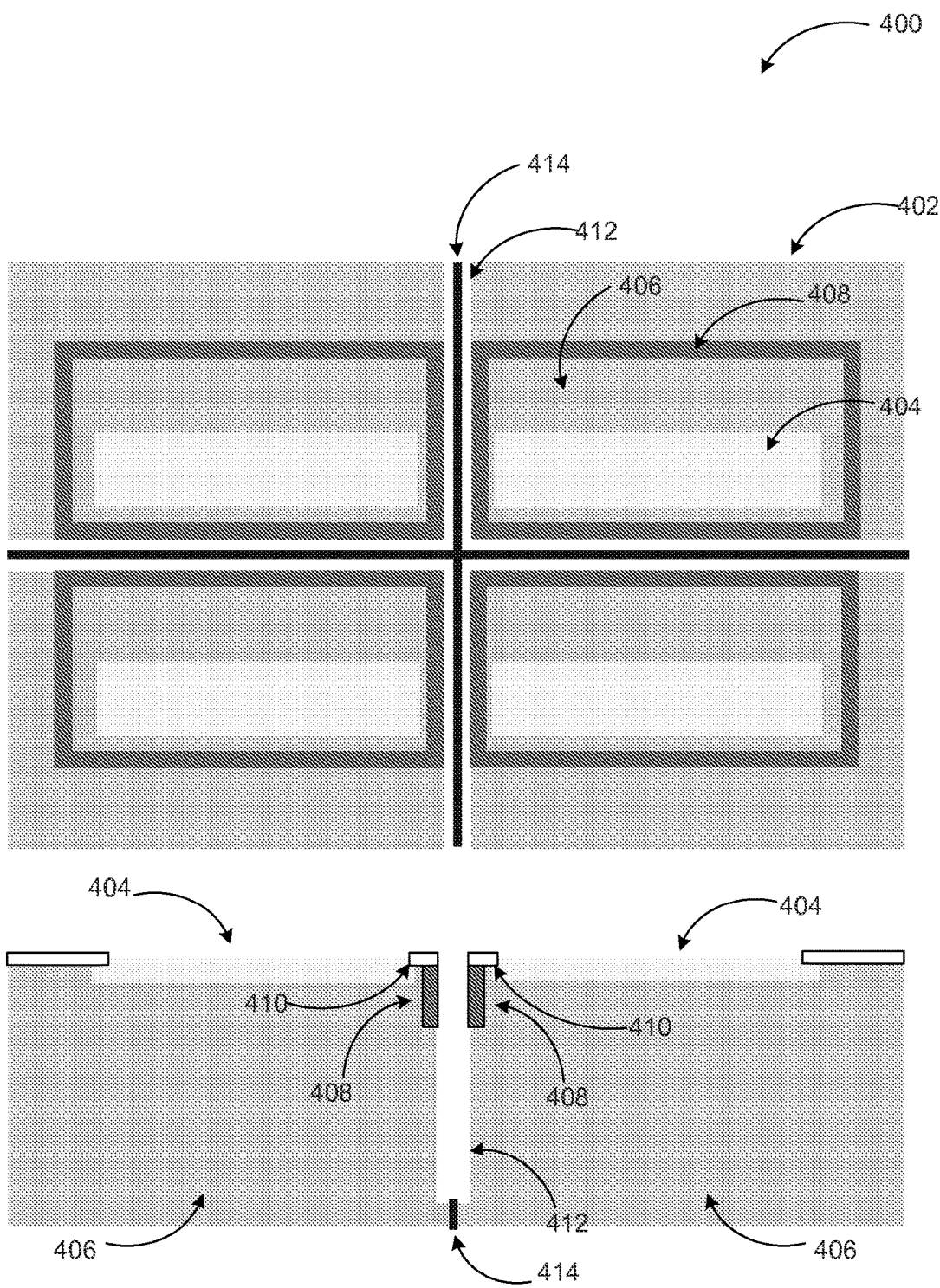
FIG. 4 illustrates top and side views of the example vertical transistor of FIG. 3 with a vertical trench post saw scribing.

FIG. 4 illustrates top and side views of the example vertical transistor of FIG. 3 with a vertical trench post saw scribing, arranged in accordance with at least some embodiments described herein.

In a diagram 400, an example vertical transistor may be composed of a substrate 402 that includes a source terminal 404, a drain terminal 406, a dielectric platform 408, and a trench 412, as seen in a top and side view of the vertical transistor. The substrate 402 may also include an insulating dielectric layer 410 that is arranged in contact with an end of the source terminal 404 and also in contact with a termination of the dielectric platform 408, as seen in the side view of the vertical transistor.

Diagram 400 is similar to the configuration of FIG. 3 after scribing is completed (e.g., scribing can be completed via mechanical saw scribe, laser cut, or similar techniques). The wafer may be cut (414) with a cut width that is smaller than the etching width of the trench 412 as shown in the side view. Because the flashover distance is predominately determined by the lateral and vertical distances (e.g., lengths of the insulating dielectric layer 410 and dielectric platform 408), a width of the cut at the bottom of the trench 412 may not have a noticeable effect on the performance of the transistor.

Figure 5:
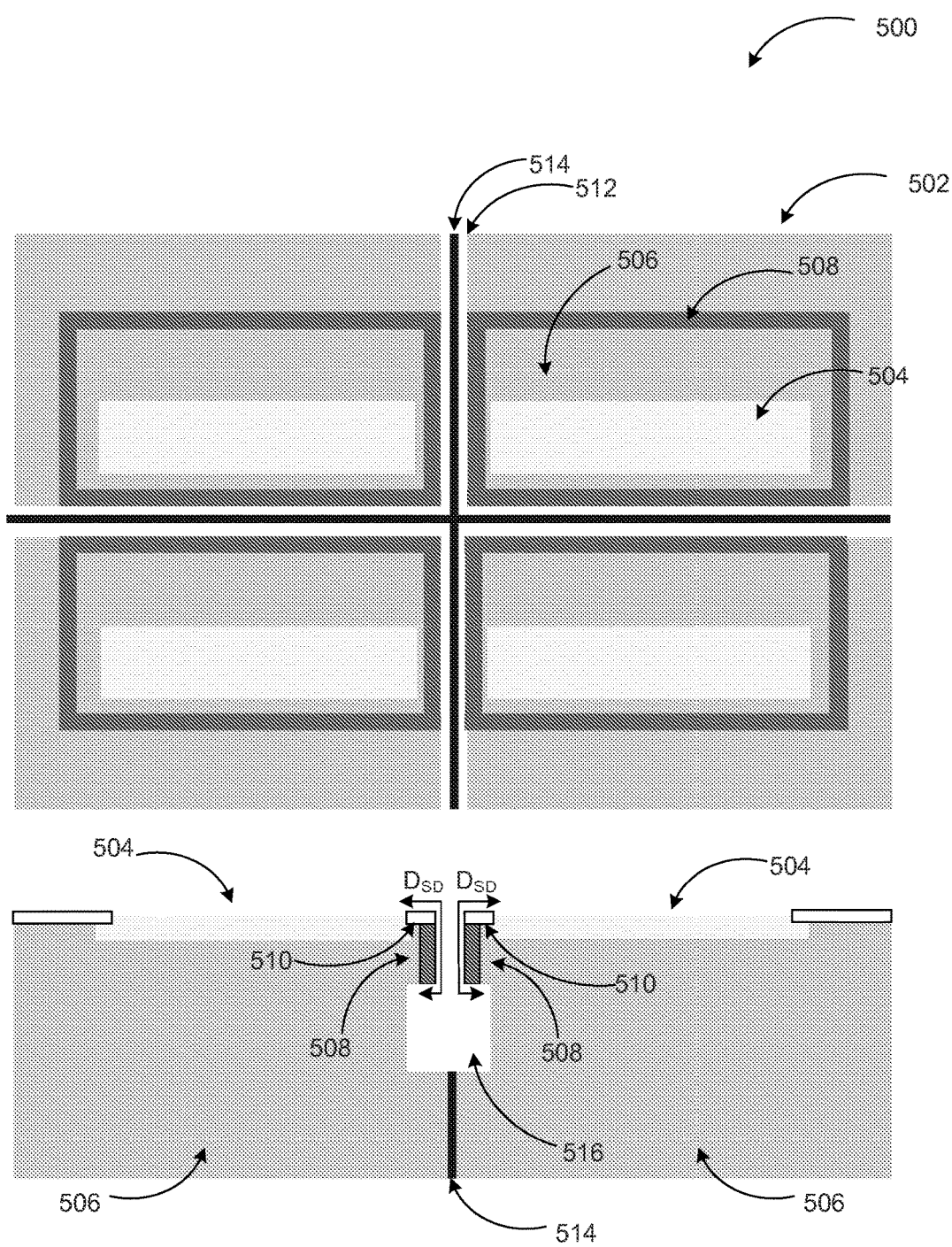
FIG. 5 illustrates top and side views of a further example vertical transistor with a vertical recessed cavity to increase effective flashover distance.

FIG. 5 illustrates top and side views of a further example vertical transistor with a vertical recessed cavity effective to increase flashover distance, arranged in accordance with at least some embodiments described herein.

In a diagram 500, an example vertical transistor may be composed of a substrate 502 that includes a source terminal 504, a drain terminal 506, a dielectric platform 508, and a trench 512, as seen in a top and side view of the vertical transistor. The substrate may also include an insulating dielectric layer 510 that is arranged in contact with an end of the source terminal 504 and also in contact with a termination of the dielectric platform 508, which may be positioned above a vertical recessed cavity 516, as seen in the side view of the vertical transistor.

According to some embodiments, the trench 512 may be formed in a bottle-like shape that includes a recessed cavity with the bottle-like being the insulating dielectric layers 510 and the dielectric platforms 508. The widening lateral shape of the trench 512 (the recessed cavity) may add incrementally to the flashover distance approximately equal to a width of the dielectric platform 508. Thus, the flashover distance may be substantially determined by a length of the insulating dielectric layer 510, a length of the dielectric platform 508, and a width of the dielectric platform 508 in this example configuration.

The trench 512 in the example configuration of diagram 500 may be formed by etching a silicon trench in scribe grid between dielectric platform edges (e.g., etching may correspond to an anisotropic etch process followed by an isotropic etch process). Diagram 500 shows an example configuration of devices after scribing. A width of the cut (514) may be narrower than a width of the broader bottom portion of the trench 512. While the trench 512 is shown with sharp corners (substantially rectangular cross-shape), embodiments may be implemented with other bottle-like shapes such as rounded edges or corners, chamfered edges or corners, cylindrical or oval shaped edges, which may yield increased overall width of the dielectric platform 508.

Figure 6:
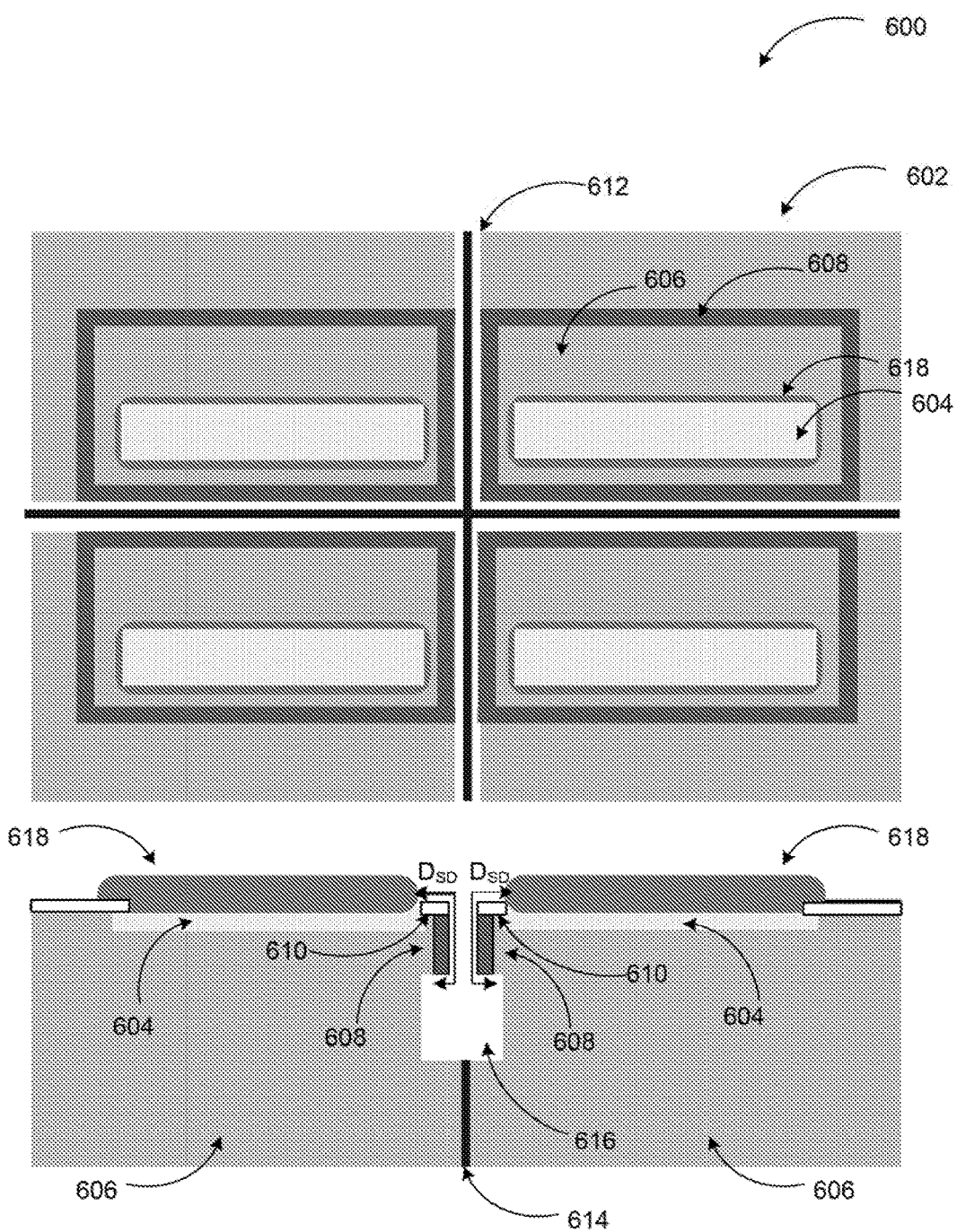
FIG. 6 illustrates top and side views of the example vertical transistor of FIG. 5 with bump structures.

FIG. 6 illustrates top and side views of an example vertical transistor similar to that illustrated in FIG. 5 with bump structures, arranged in accordance with at least some embodiments described herein.

In a diagram 600, an example vertical transistor may be composed of a substrate 602 that includes a source terminal 604 with a bump 618, a drain terminal 606, a dielectric platform 608, and a trench 612, as seen in a top and side view of the vertical transistor. The substrate 602 may also include an insulating dielectric layer 610 that is arranged in contact with an end of the source terminal 604 and also in contact with a termination of the dielectric platform 608, which may be positioned above a vertical recessed cavity 616, as seen in the side view of the vertical transistor.

The die with bump configuration shown in diagram 600 illustrates that the flashover distance may be increased using an etched trench (e.g., straight or bottle-like shaped) may also be implemented with bumps. The bumps may be formed in the source region and gate region and enable the electrical contact from the transistor device die to the corresponding contacts in the package used for the transistor device. Thus, the source bump may contact the active area of the transistor device to the portion of the package used to contact the source, which may typically be used as the electrical ground. Similarly, the gate bump may connect the gate of the transistor to the corresponding gate contact in the package. In this example configuration, the source and gate bumps may be connected to the package using flip-chip assembly and the back of the die may be the drain, which may be connected to another electrode in the package using wirebonds, straps, clips, and similar mechanisms. The formation of the trench 612 through etching may be independent of the formation of bumps on the die. Thus, even though bumps 618 may be formed on the die, the total flashover distance may still be determined by a length of the insulating dielectric layer 610, a length of the dielectric platform 608, and a width of the dielectric platform 608.

Figure 7:
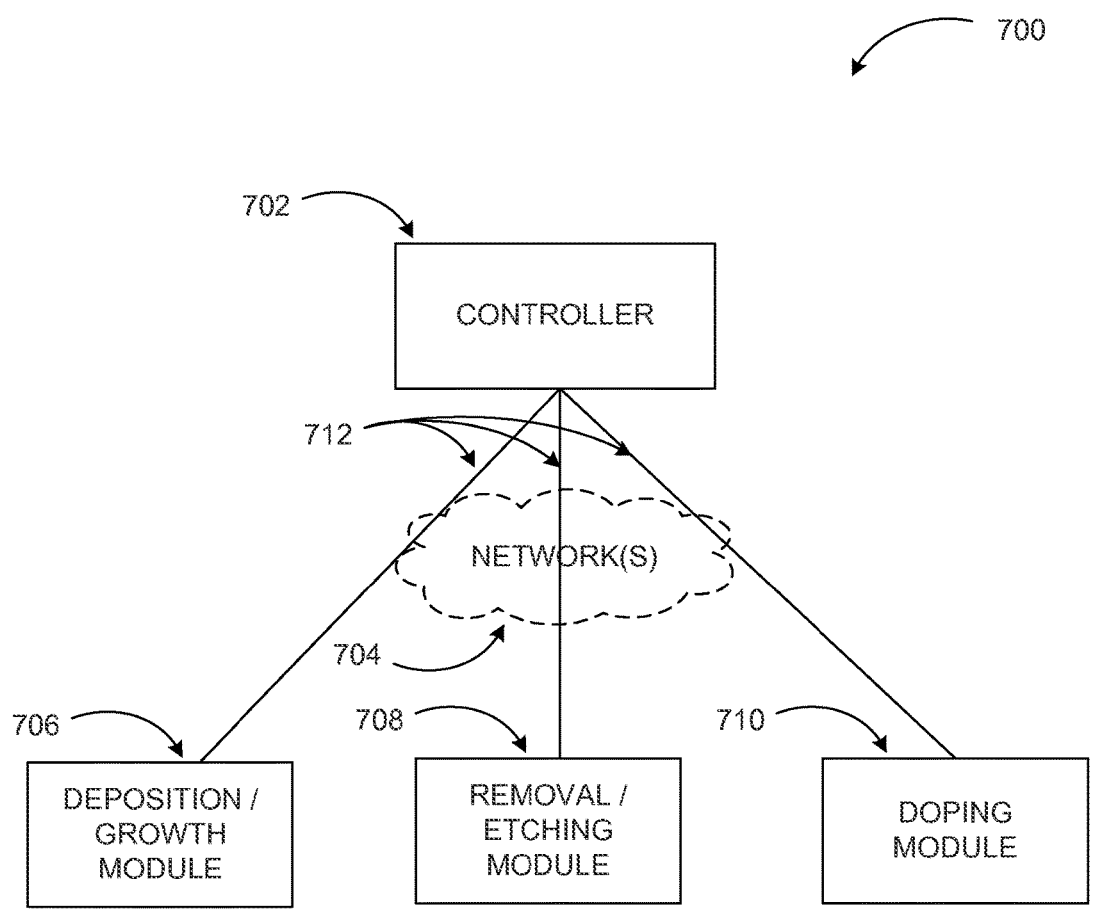
FIG. 7 illustrates an example fabrication system for a vertical transistor with flashover protection.

FIG. 7 illustrates an example fabrication system for a vertical transistor with flashover protection, arranged in accordance with at least some embodiments described herein.

Diagram 700 includes an example fabrication system with a controller 702, deposition/growth module 706, removal/etching module 708, and doping module 710. In some embodiments, the controller 702 may be directly coupled to the deposition/growth module 706, the removal/etching module 708, and the doping module 710 in an integrated fabrication system. In other embodiments, the controller 702 may be a remotely located controller that is communicatively coupled to the deposition/growth module 706, the removal/etching module 708, and the doping module 710. In still other examples, one or more network(s) 704, either wired or wireless, may be configured to provide communicative coupling between the controller 702 and the deposition/growth module 706, the removal/etching module 708, and the doping module 710.

The controller 702 may be configured to coordinate operations of one or more of the deposition/growth module 706, the removal/etching module 708, the doping module 710, as well as other optional modules (not shown) such as a scribing module, an annealing module, and similar ones. In some examples, the controller 702 may coordinate the operation of the various modules via operation of one or more control signals 712. The various control signals 712 may be of a digital format or an analog format, as may be required to interface with the corresponding module. Each signal may be generated (e.g., asserted, de-asserted, pulsed, transmitted/received, communicated, etc.) in response to operation of instructions, in some examples.

The controller 702 may correspond to a software controller, a hardware controller, or a combination thereof. Example controllers may include one or more computers, general purpose processors, special purpose processors, circuits, application specific integrated circuits (ASICs) or combinations thereof. Example processors may include micro-processors, micro-controllers, complex instruction set computer (CISCs) processors, reduced instruction set computer (RISC), or other similar variations thereof. The operation of some controller implementations may include execution of hardware based instructions such as from firmware, software based instructions, or combinations thereof.

The deposition/growth module 706 may be configured (e.g., via one or more control signals 712 from controller 702) to perform various actions such as forming of drain and/or source terminals, gate terminal, insulating dielectric layer, etc. by using various material deposition or growth techniques such as chemical vapor deposition (CVD), atomic layering deposition (ALD), sputter deposition, and similar ones.

The removal/etching module 708 be configured (e.g., via one or more control signals 712 from controller 702) to perform actions such as thinning of portions of the vertical transistor device, forming of the trench, etc. by using techniques such as wet chemical etching, gaseous chemical etching, plasma etching, and similar ones.

The doping module 710 may be configured (e.g., via one or more control signals 712) to perform actions such as forming of the drain and source regions by adding impurities into intrinsic materials (e.g., intrinsic or pure silicon material). The result of doping is to change the carrier concentration to yield a material of a desired type (p-type, n-type), based on the number of impurities. Lightly doped materials are extrinsic materials, and heavily doped are degenerate materials.

Embodiments are not limited to the example modules of diagram 700. A system to fabricate a vertical transistor with flashover protection may include additional or fewer fabrication modules, and some of the operations may be combined to be performed by the same modules. In yet other examples, the operations, such as deposition operations, may be split among multiple modules.

Figure 8:
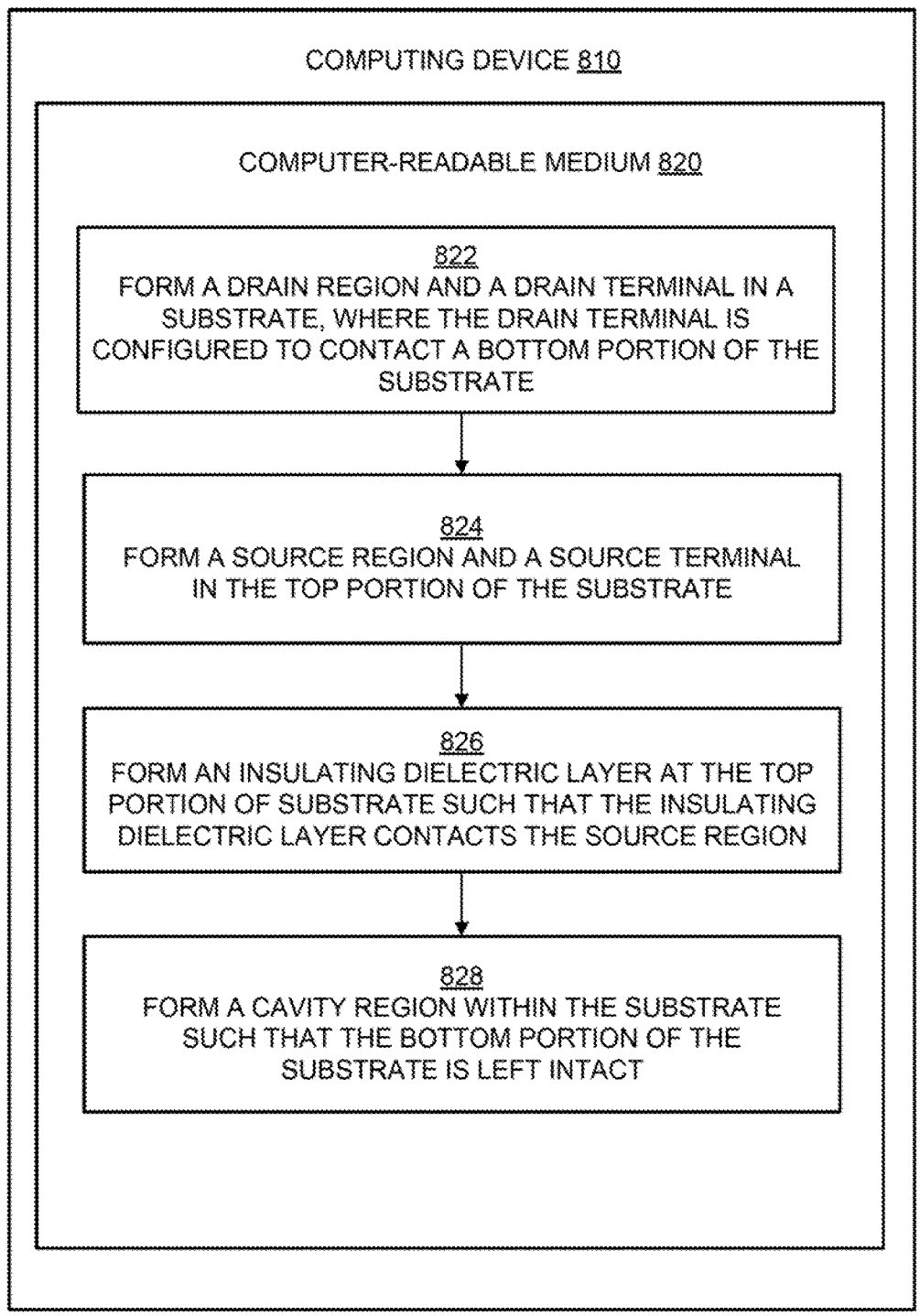
FIG. 8 illustrates a flowchart of a process for fabricating an example vertical transistor with flashover protection, all arranged in accordance with at least some embodiments described herein.

FIG. 8 illustrates a flowchart of a process for fabricating an example vertical transistor with flashover protection, arranged in accordance with at least some embodiments described herein.

Example methods may include one or more operations, functions or actions as illustrated by one or more of blocks 822, 824, 826 and/or 828, and may in some embodiments be performed by a controller for a transistor fabrication system. The fabrication system may include a number of modules for various stages of fabrication such as etching, deposition, scribing, etc. Some or all of those modules may be managed by a controller that instructs the respective modules to perform the operations 822-828. In some embodiments, the controller may be a computing device such as a desktop computer, a server, a laptop computer, or other forms of computing devices. Thus, the operations described in the blocks 822-828 may also be stored as computer-executable instructions in a non-transitory computer-readable medium, such as a computer-readable medium 820 of a computing device 810, and may be executable by one or more processors.

A vertical transistor according to embodiments may be fabricated by the fabrication system using at least one of the semiconductor fabrication techniques selected from the group of CVD, low pressure CVD (LPCVD), atmospheric pressure CVD (APCVD), ultrahigh vacuum CVD (UHVCVD), ALD, molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

An example process to fabricate a chip may begin with block 822, "FORM A DRAIN REGION AND A DRAIN TERMINAL IN A SUBSTRATE, WHERE THE DRAIN TERMINAL IS CONFIGURED TO CONTACT A BOTTOM PORTION OF THE SUBSTRATE." The drain region may be formed in the substrate by doping a bottom portion of the substrate with dopants effective to form a drain region of a first type (e.g., a p-type or n-type drain region). For example a p-type drain region may be formed by doping intrinsic silicon with a first material (e.g., Boron, Arsenic, Phosphorous, etc.), and the resulting material may have a carrier concentration of electrons or holes so that it is p-type or n-type depending on the electron-hole concentration. Conductive material (e.g., metals such as Copper, Aluminum, Titanium, Nickel, etc.) may be deposited on the drain region of the substrate to form the drain terminal.

Block 822 may be followed by block 824, "FORM A SOURCE REGION AND A SOURCE TERMINAL IN THE TOP PORTION OF THE SUBSTRATE." A top portion of the substrate may be doped with dopants effective to form a source region of a second type (e.g., p-type or n-type) within the substrate. Conductive material (e.g., metals such as Copper, Aluminum, Titanium, Nickel, etc.) may be deposited on the source region of the substrate to form the source terminal. The first type of region is of a different type than the second type of region. For example, a p-type drain region would have a corresponding n-type source region; while an n-type drain region would have a corresponding p-type source region.

Block 824 may be followed by block 826, "FORM AN INSULATING DIELECTRIC LAYER AT THE TOP PORTION OF SUBSTRATE SUCH THAT THE INSULATING DIELECTRIC LAYER CONTACTS THE SOURCE REGION." The insulating dielectric layer may be grown or deposited between the source terminal and an edge of the dielectric platform. A length of the insulating dielectric layer may form a first part of the flashover distance.

Block 826 may be followed by block 828, "FORM A CAVITY REGION WITHIN THE SUBSTRATE SUCH THAT THE BOTTOM PORTION OF THE SUBSTRATE IS LEFT INTACT." A trench (with or without a recessed cavity) may be formed in the substrate through, for example, etching. A top portion of the trench may have the dielectric platform as a boundary. The length of the dielectric platform may form a second part of the flashover distance (the first part of the flashover distance being the length of the insulating dielectric layer as described above). In case of a bottle-shaped trench with a recessed cavity, the width of the dielectric platform may form the third part of the flashover distance.

The blocks included in the above described process are for illustration purposes. Fabrication of a vertical transistor with flashover protection may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

According to some examples, a semiconductor device is described. An example semiconductor device may include a substrate having a top portion and a bottom portion, a source terminal configured in contact with the top portion of the substrate, a drain region configured in contact with the bottom portion of the substrate, and an insulating dielectric layer. The insulating dielectric layer may be located in the top portion of the substrate and configured in contact with the source region, where the substrate may include a cavity region located substantially between the insulating dielectric layer and the bottom portion of the substrate.

According to other examples, the insulating dielectric layer may be located along edges of the semiconductor device in the top portion of the substrate. A lateral length of the insulating dielectric layer may be less than a flashover distance associated with a particular operating voltage for the semiconductor device. A width of the cavity region of the substrate may be in a range from about 10 micrometers to about 100 micrometers. A height of the cavity region of the substrate may be in a range from about 2 micrometers to about 100 micrometers.

According to further examples, the cavity region of the substrate may include a recessed cavity in the substrate positioned below the source region. A height of the recessed cavity may be less than a height of the cavity region of the substrate. A height of the recessed cavity may be in a range from about 20 micrometers to about 100 micrometers. A width of the recessed cavity may be in a range from about 10 micrometers to about 50 micrometers. A length of the insulating dielectric layer may be in a range from about 10 micrometers nm to about 200 micrometers.

According to yet other examples, the semiconductor device may be a vertical transistor. The semiconductor device may also be a vertical power transistor. The semiconductor device may further be a vertical radio frequency (RF) power transistor. The semiconductor device may also be a Vertical Double-diffused Metal Oxide Semiconductor (VDMOS). A portion of the substrate surrounding the cavity region may be doped at a level such that a concentration of carriers in the portion of the substrate surrounding the cavity region is substantially the same as that of the drain region.

According to other examples, methods of fabricating a semiconductor device are described. An example method may include forming a drain region at a bottom portion of a substrate, forming a vertical spacer gate and a source region in the substrate, forming an insulating dielectric layer in a top portion of the substrate such that the insulating dielectric layer contacts the source region, and forming a cavity region located substantially between the insulating dielectric layer and the bottom portion of the substrate.

According to some examples, forming the drain region may include growing an epitaxial layer on a surface of the substrate, reducing a thickness of the substrate, and forming a conductive contact on a backside of the substrate to form a drain terminal. The method may further include forming the insulating dielectric layer along edges of the semiconductor device in the top portion of the substrate.

According to other examples, the method may also include reducing a length of the insulating dielectric layer at the cavity region of the substrate. The method may yet include forming an additional recessed cavity in the substrate along an edge of the cavity region, where a height of the recessed cavity is less than a height of the cavity region. Forming the additional recessed cavity may include employing one or more of anisotropic etching and isotropic etching. Forming the additional recessed cavity may further include employing a deep reactive ion etching (DRIE) process.

According to further examples, methods of fabricating a vertical transistor with flashover protection are described. An example method may include forming a drain region at a bottom portion of a substrate, forming a source region in a top portion of the substrate, forming an insulating dielectric layer in the top portion of the substrate near an edge of the vertical transistor such that the insulating dielectric layer is configured to contact the source region, and forming a cavity region in a portion of the substrate and a portion of the insulating dielectric layer along the edge of the vertical transistor effective to increase a flashover distance for a particular operating voltage without increasing a die size.

According to some examples, forming the cavity region may include leaving the bottom portion of the substrate intact such that an additional vertical distance and an additional lateral distance are added to the flashover distance. Forming the cavity region may also include carving a recessed cavity in the substrate underneath the insulating dielectric layer such that an additional vertical distance and two additional lateral distances are added to the flashover distance.

According to yet other examples, methods of fabricating a semiconductor device are described. An example method may include forming a drain region at a bottom portion of a substrate, forming a gate and a source region in a top portion of the substrate, forming an insulating dielectric layer in a top portion of the substrate near a first edge of the semiconductor device such that the insulating dielectric layer is configured to contact the source region, and forming a cavity region in the substrate along the first edge of the semiconductor device such that the bottom portion of the substrate is left intact.

According to further examples, the method may also include forming another insulating dielectric layer in the top portion of the substrate near a second edge of the semiconductor device such that the other insulating dielectric layer is configured to contact the source region, where the insulating dielectric layer the other insulating dielectric layer are contiguous.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of this disclosure.

The present disclosure is not to be limited in terms of the particular embodiments described in this application, which are intended as illustrations of various aspects. Many modifications and variations can be made without departing from its spirit and scope Functionally equivalent methods and apparatuses within the scope of the disclosure, in addition to those enumerated herein, will be possible from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also be viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A semiconductor device, comprising:
a substrate having a top portion and a bottom portion;
a source terminal configured in contact with the top portion of the substrate;
a drain region configured in contact with the bottom portion of the substrate; and
an insulating dielectric layer located in the top portion of the substrate and configured in contact with the source region, wherein the substrate includes a cavity region located substantially between the insulating dielectric layer and the bottom portion of the substrate.

2. The semiconductor device of claim 1, wherein the insulating dielectric layer is located along edges of the semiconductor device in the top portion of the substrate.

3. The semiconductor device of claim 1, wherein a lateral length of the insulating dielectric layer is less than a flashover distance associated with a particular operating voltage for the semiconductor device.

4. The semiconductor device of claim 1, wherein the cavity region of the substrate includes a recessed cavity in the substrate positioned below the source region.

5. The semiconductor device of claim 4, wherein a height of the recessed cavity is less than a height of the cavity region of the substrate.

6. The semiconductor device of claim 1, wherein the semiconductor device is a vertical transistor.

7. The semiconductor device of claim 1, wherein the semiconductor device is one of a vertical power transistor, a vertical radio frequency (RF) power transistor, and a vertical double-diffused metal oxide semiconductor (VDMOS).

8. The semiconductor device of claim 1, wherein a portion of the substrate surrounding the cavity region is doped at a level such that a concentration of carriers in the portion of the substrate surrounding the cavity region is substantially the same as that of the drain region.

9. A method of fabricating a semiconductor device, the method comprising:
    forming a drain region at a bottom portion of a substrate;
    forming a vertical spacer gate and a source region in the substrate;
    forming an insulating dielectric layer in a top portion of the substrate such that the insulating dielectric layer contacts the source region; and
    forming a cavity region located substantially between the insulating dielectric layer and the bottom portion of the substrate.

10. The method of claim 9, wherein forming the drain region comprises:
    growing an epitaxial layer on a surface of the substrate;
    reducing at thickness of the substrate; and
    forming a conductive contact on a backside of the substrate to form a drain terminal.

11. The method of claim 9, further comprising:
    forming the insulating dielectric layer along edges of the semiconductor device in the top portion of the substrate.

12. The method of claim 9, further comprising:
    reducing a length of the insulating dielectric layer at the cavity region of the substrate.

13. The method of claim 9, further comprising:
    forming an additional recessed cavity in the substrate along an edge of the cavity region, wherein a height of the recessed cavity is less than a height of the cavity region.

14. The method of claim 13, wherein forming the additional recessed cavity comprises employing one or more of anisotropic etching and isotropic etching.

15. The method of claim 13, wherein forming the additional recessed cavity further comprises employing as deep reactive ion etching (DRIE) process.

16. A method of fabricating a vertical transistor with flashover protection, the method comprising:
    forming a drain region at a bottom portion of a substrate;
    forming a source region in a top portion of the substrate;
    forming an insulating dielectric layer in the top portion of the substrate near an edge of the vertical transistor such that the insulating dielectric layer is configured to contact the source region; and
    forming a cavity region in a portion of the substrate and a portion of the insulating dielectric layer along the edge of the vertical transistor effective to increase at flashover distance for a particular operating voltage without increasing a die size.

17. The method of claim 16, wherein forming the cavity region comprises leaving the bottom portion of the substrate intact such that an additional vertical distance and an additional lateral distance are added to the flashover distance.

18. The method of claim 16, wherein forming the cavity region comprises carving a recessed cavity in the substrate underneath the insulating dielectric layer such that an additional vertical distance and two additional lateral distances are added to the flashover distance.

19. A method of fabricating a semiconductor device, the method comprising:
    forming a drain region at a bottom portion of a substrate;
    forming a gate and a source region in a top portion of the substrate;
    forming an insulating dielectric layer in a top portion of the substrate near a first edge of the semiconductor device such that the insulating dielectric layer is configured to contact the source region; and
    forming a cavity region in the substrate along the first edge of the semiconductor device such that the bottom portion of the substrate is left intact.

20. The method of claim 19, further comprising:
    forming another insulating dielectric layer in the top portion of the substrate near a second edge of the semiconductor device such that the other insulating dielectric layer is configured to contact the source region, wherein the insulating dielectric layer the other insulating dielectric layer are contiguous.

* * * * *

UNITED STATES PATENT AND TRADEMARK OFFICE
CERTIFICATE OF CORRECTION

PATENT NO. : 9,524,960 B2  
APPLICATION NO. : 14/761599  
DATED : December 20, 2016  
INVENTOR(S) : Gogoi Page 1 of 1

It is certified that error appears in the above-identified patent and that said Letters Patent is hereby corrected as shown below:

On the Title Page

In Item (73), under "Assignee", in Column 1, Lines 1-3, delete "EMPIRE TECHNOOGY DEVELOPMENT LLC, Wilmington, DE (US)" and insert -- EMPIRE TECHNOLOGY DEVELOPMENT LLC, Wilmington, DE (US) --, therefor.

Signed and Sealed this  
Twenty-fifth Day of April, 2017

Michelle K. Lee  
*Director of the United States Patent and Trademark Office*